United States Patent [19]

Gujral et al.

[11] Patent Number: 5,638,015
[45] Date of Patent: Jun. 10, 1997

[54] AVOIDING INSTABILITY

[75] Inventors: Manoj Gujral, Santa Clara; Greggory D. Donley; Paul N. Israel, both of Sunnyvale, all of Calif.

[73] Assignee: Unisys Corporation, Blue Bell, Pa.

[21] Appl. No.: 493,383

[22] Filed: Jun. 21, 1995

[51] Int. Cl.$^6$ ............................... H03K 5/00; H03K 5/13
[52] U.S. Cl. ..................... 327/144; 327/145; 327/199; 327/213; 327/298
[58] Field of Search ....................... 327/199, 200, 327/202, 205, 213, 218, 144, 145, 146, 141, 154, 298

[56] References Cited

U.S. PATENT DOCUMENTS

| | | | |
|---|---|---|---|
| 4,495,629 | 1/1985 | Zasio et al. | 327/202 |
| 4,745,302 | 5/1988 | Hanawa et al. | 327/218 |
| 4,851,710 | 7/1989 | Grivna | 307/269 |
| 4,914,325 | 4/1990 | Yamada | 307/592 |
| 4,965,472 | 10/1990 | Anderson | 307/465 |
| 4,973,860 | 11/1990 | Ludwig | 327/145 |
| 5,128,970 | 7/1992 | Murphy | 307/269 |
| 5,233,617 | 8/1993 | Simmon et al. | 307/269 |
| 5,418,825 | 5/1995 | Cantwell et al. | 377/48 |

FOREIGN PATENT DOCUMENTS 404189023  7/1992  Japan ................. 327/145

OTHER PUBLICATIONS

IBM Technical Disclosure Bulletin: "Pulse Synchronizer INput", by DuvalSaint vol. 20, No. 1 Jun. 1977.

*Primary Examiner*—Timothy P. Callahan
*Assistant Examiner*—T. Lam
*Attorney, Agent, or Firm*—John J. McCormack; Mark T. Starr

[57] ABSTRACT

Described are techniques to stabilize storage devices receiving signals from plural asynchronous docks, especially to avoid "metastability", in particular, a multi-dock pulse synchronizer circuit with an IN-section for receiving and storing prescribed impulses and input cock signals, and for responsively outputting intermediate signals: and an OUT-section for receiving and storing the intermediate pulses, synchronous with certain output clock signals and processing them to generate certain output-signals which avoid metastability.

13 Claims, 2 Drawing Sheets

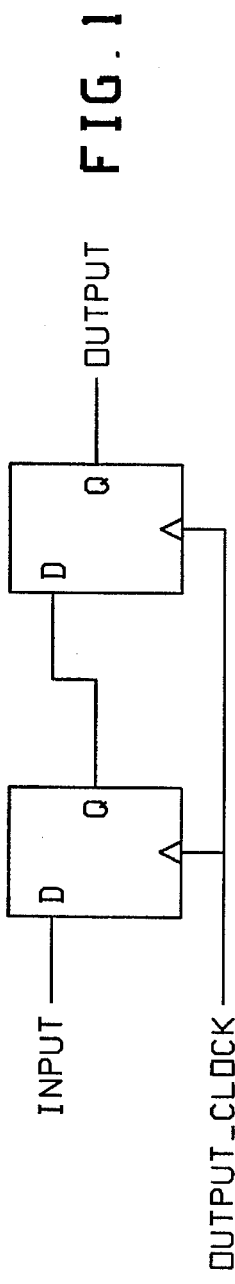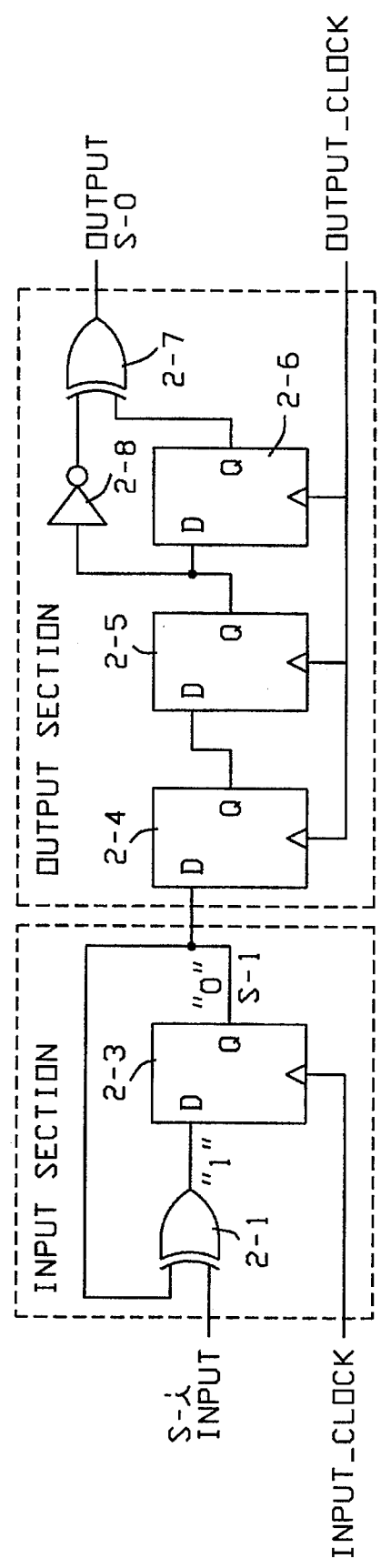

AVOIDING INSTABILITY

This involves techniques to stabilize storage devices receiving signals from plural asynchronous clock means, and especially to avoid "metastability".

BACKGROUND, FEATURES

In using digital storage means (e.g., flip-flops), workers are at times confronted with "multiple" clock signals; i.e., signals generated or received with respect to two or more different clock sources.

These multiple clocks are often derived from different oscillator circuits and therefore are asynchronous. This means that there is no relationship between the frequency or the phase of these clocks.

In designing logic circuits which contain signals generated by two or more asynchronous clocks, the designer must be careful to avoid metastability problems. A flip-flop is said to become metastable when its input changes at same time as the clock signal that is clocking-in the input data such that the flip-flop output value takes an unusually long time to settle to a stable value.

To avoid "metastability" problems, one can use synchronizing circuits which take, as input, signals generated with respect to one clock, and as output, a version of the incoming signal that is synchronized to a second clock signal which was asynchronous to the first clock. Although the possibility of metastability still exists in these circuits, it can be localized to small block of logic; and, its probability of causing malfunctions in the rest of the design is rather insignificant.

One possible method of synchronizing is to use two flip flops in series; e.g., note FIG 1: a pair of "D type" flip-flops, assumed to be "edge-triggered", ---, with output clocked from a common source (Note: another "edge-trigger" means can be substituted.

In this configuration, a change in the input signal appears on the output a maximum of two clock periods after it appears at the input to the first flip-flop. In this situation, the first flip-flop still may become metastable if the data changes at the rising edge of the clock, but as long as this metastability resolves within one clock period, the output of the second flip-flop will always be valid and will output a signal synchronized to the clock signal. This can be referred to as "level synchronization" because the synchronized output eventually reflects the level of the input, whether it is high or low. Such synchronization carries the restriction that, after changing value, the input signal must remain at the new value longer than the period of the synchronizing clock (pulse persistence)—whereby to assure that the output will eventually reflect the new value.

Occasionally, a designer may want to synchronize a signal which represents some event, such as loading a register, clearing a counter, or detecting an error. Such an event is commonly represented by a short pulse which is exactly one clock period in length. If the clock to which this signal is to be synchronized is slower than the clock which was used to generate the pulse, then this signal will not meet the "level synchronizer's" restriction that the input remain stable for longer than the period of the synchronizing clock. In this situation another form of synchronizer is required.

We have developed "pulse synchronizers" designed to handle just such situations. Two such synchronizers are described here; each has different characteristics and restrictions on the types of pulses it will synchronize.

It is an object hereof to address such needs, and provide related features. A related object is to teach "pulse synchronizer" means, e.g., to address metastability logic circuit involves multiple asynchronous where a clocks.

Other objects and advantages of the present invention will be apparent to those skilled in the art.

BRIEF DESCRIPTION OF THE DRAWINGS

The foregoing and other features and advantages of the present invention will be appreciated by workers as they become better understood by reference to the following detailed description of the present preferred embodiments, these being considered in conjunction with the accompanying drawings, wherein like reference symbols denote like elements:

FIG. 1 is a very schematic, idealized showing of synchronizing flip-flops; apt for using the invention;

FIG. 2 depicts a schematic "first" type of pulse synchronizer embodiment; and

DETAILED DESCRIPTION OF PREFERRED EMBODIMENT

Figure 3:
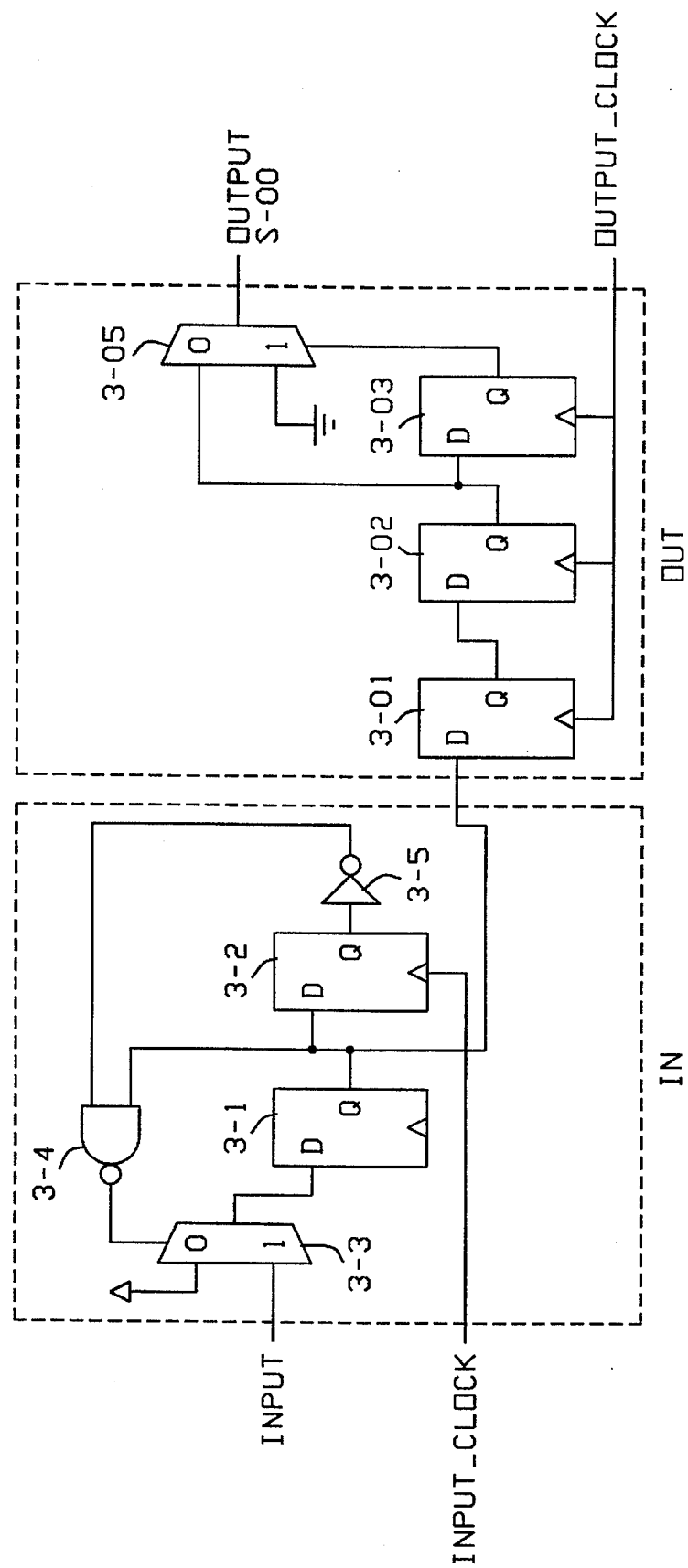
FIG. 3 depicts schematically, a "second" type of pulse synchronizer embodiment.

A "first" one-clock type pulse synchronizer is shown in FIG. 2. This synchronizer can be divided into an input section and an output section. The input section consists of an Exclusive Or (XOR) gate 2-1 receiving input signal s-i, and a first flip-flop 2-3, coupled to receive output from gate 2-1 and to output a signal S-1 fed to the output section and fed-back to gate 2-1, as clocked by an input-clock signal.

If the input pulse length (duration of s-i) is exactly one clock period, then the output S-1 of the input section toggles each time a pulse occurs on the input signal s-i. Therefore, if the input section flip-flop is outputting "0" (zero), and a single clock pulse occurs on the input, the flip-flop will begin outputting a "1". If the input section flip-flop is outputting "1" and a single clock pulse occurs on the input, the flip-flop will begin outputting a '0'. Stated otherwise, this input section will detect any clock pulse (single-width), correct to "level-transaction" (e.g., low IN yield hi OUT, hi IN yield low OUT); then the output section can synchronize this to local clocks (flops 2-4, 2-5) and derive a single synchronized output pulse.

The output section of the synchronizer consists of three flip-flops 2-4, 2-5, 2-6, in series, and a final XOR gate 2-7. The first two (2-4, 2-5) of these flip-flops act as a "level synchronizer", synchronizing the output S-1 of the input section to the output clock. The final flip-flop 2-6 and XOR gate 2-7 take this synchronized signal and use it to generate a single clock pulse on the output.

[Note: output from second-in-line flip-flop 2-5 is also fed to inverter means 2-8, then to X-OR gate 2-7, along with output from final flip-flop 2-6, to derive the output S-0 from this output section.]

This circuit is advantageous and simple; e.g., it needs only four flip-flops and two XOR gates. This simplicity is attractive; e.g., requiring little area when implemented in an ASIC. It also can handle a wide range of input and output clock frequencies. The ratio between the input and output clocks is dependent upon the minimum interval between input pulses. The output clock frequency must be greater than 2/n times the input clock frequency where n is the minimum input pulse interval (in clocks).

Therefore, if the input pulses can occur every other clock (i.e., one pulse every two clocks), then the output clock frequency must be at least 2/2 times that of the input clock, or any frequency greater than the input clock.

An input pulse interval of one every 3 clocks results in an output clock frequency that must be at least 3/3 of the input clock frequency. This flexibility allows this circuit to operate in applications where the asynchronous clock frequencies are not fixed.

One restriction on the use of this circuit is that the input signal must present pulses that are a single clock period in width. In addition, pulses which occur at a frequency greater than that allowed by the input and output clock ratios may result in an output pulse which is greater than one clock period in width, or in no pulse at all.

Second Synchronizer:

A second, "multi-clock" type pulse synchronizer design is shown in FIG. 3. This design contains an input section and an output section. The input section consists of two edge-triggered, D-type flip-flops 3-1, 3-2 in series plus some additional circuitry (e.g., preferably, with a 2/1 multiplexer 3-3 at the input (input to 3-3 tied high), a NAND gate 3-4 for the output of both flops 3-1,3-2, with inverter 3-5 feeding the output of flop 3-2 to gate 3-4. NAND gate output is fed to MUX 3-3 (select line thereof), to select which input appears on output of MUX 3-3. Thus, gate 3-4 can select a zero (or one) input (zero:.logical "high"; one=logical low, or ground) and convert to clock pulses which are two+clock-widths long (one clock-width IN yields two-widths OUT; while two+widths IN yields same-width output) --- then the out-section converts this to a one-clock-width pulse.

The output stage will be noted as comprising three D-type flip-flops 3-01,3-02,3-03, in series and coupled to a common output clock (signal), with output from final flop 3-03 fed to the select line of a MUX 3-05 (with one input tied low), and output from the intermediate flop 3-02 also fed t MUX 3-05 (to a "high" input terminal thereof; preferably this is a 2/1 MUX).

The input section will detect the rising edge of the input signal, and responsively generate a signal to the output stage which is guaranteed to be at least two input clock periods wide. The output stage (-section) then synchronizes this signal (at F/F 3-01, 3-02) to the output clock and generates a single pulse s-oo on its output line.

This circuit has certain advantages over the "first" design (above), as well as some restrictions. One advantage is that the input signal does not have to be the width of a single input clock pulse. Since the circuit detects the rising edge of the input signal, the signal can transition high and remain high indefinitely, yet the output in this case will still be a single clock pulse, one clock wide.

The input signal must be restricted to a single rising edge (transition from 0 to 1) every three clocks if the output clock is faster than the output clock.

If the output clock is faster than-one half the frequency of the input clock, then the input signal may contain one rising edge, at most, every four clocks; also rising edges must be separated by at least two clock periods of "low" (i.e., the signal may be high for one period and low for three, or be high for two and low for two --- but not high for three and low for one period).

Both of these inventions can be implemented with 'D' type edge triggered flop-flops, or with any other edge-trigger storage device (e.g., JK flip flop, toggle F/F, etc.) and the design will be essentially equivalent. Likewise the discrete gates (exclusive-or, multiplexer, and, inverter, etc.) can be replaced with any equivalent logic and the design will be functionally equivalent.

Reprise:

One may use such synchronizers wherever there is a control signal and with single clock pulses, with the control signal to be synchronized from one clock domain to another (e.g, series of clock pulses from plural sources). Such may be found in a computer I/O subsystem where multiple clocks are likely, or in the cache of a server where multiple clock domains can be present.

What is claimed is:

1. A multi-clock pulse synchronizer, circuit comprising an IN-section for receiving and storing prescribed in-pulses and input dock signals, and for responsively outputting intermediate signals; and an OUT-section for receiving and storing said intermediate signals synchronous with output dock signals and processing them to generate output-signals, which avoid metastability;

said IN-section comprising an IN bistable storage stage and IN-MUX means connected thereto, plus gate means arranged to receive a version of said intermediate signals fed-back from said storage stage, and to responsively trigger output thereto from said IN-MUX means.

2. The invention of claim 1, where said OUT-section comprises a first OUT bistable storage stage connected to receive said intermediate signals in synchronism with said output clock signals and to responsively output secondary OUT-signals, and an output stage comprising second bistable OUT-storage means for receiving and processing said secondary OUT-signals, and responsively outputting said output-signals.

3. The invention of claim 2, wherein said OUT storage means comprises a bistable output storage circuit and associated OUT-MUX means connected to be inputted by said bistable output storage circuit and by said first OUT bistable storage stage, whereby the output from said bistable output storage circuit selects the secondary, OUT signals of said first OUT bistable storage stage as said output-signals, now synchronized with said output clock signals.

4. The invention of claim 3, wherein all said storage stages and storage circuits comprise bistable edge-trigger storage circuits.

5. The invention of claim 4, wherein all said storage circuits comprise flip-flop circuits.

6. The invention of claim 5, wherein all said storage circuits comprise D-type flip-flop circuits.

7. The invention of claim 6, wherein said gate means comprises NAND gate means.

8. The invention of claim 7, where said IN bistable storage stage comprises first and second flip-flop means, in series, and initiated by said input clock signals.

9. The invention of claim 8, where said first OUT bistable storage stage comprises a first and second flip-flop means in series, with all said OUT section flip-flops initiated by said output clock signals.

10. A method of synchronizing output from series connected bistable storage means involving input and output clock signals which can be asynchronous, this method involving synchronizing said output by a multi-clock pulse synchronizer circuit and also:

providing an IN-section to receive and store prescribed in-pulses and input clock signals, to responsively generate prescribed intermediate signals; and also providing an OUT-section to receive, store and process said intermediate signals, synchronous with output clock signals, and responsively generate output-signals which avoid metastability problems;

said IN-section being made to comprise an IN-bistable storage stage and IN-MUX means connected thereto, plus gate means arranged to receive a version of said intermediate signals fed-back from said storage stage and to responsively trigger output thereto from said IN-MUX means.

11. The method of claim 10, wherein said OUT-section is made to comprise a first OUT bistable storage stage connected to receive said intermediate signals in synchronism with said output clock signals, to process these, and to responsively output secondary OUT-signals, plus an output stage comprising second bistable OUT-storage means to receive and process said secondary OUT-signals, and responsively generate said output-signals.

12. The method of claim 11, wherein said second bistable OUT-storage means comprises a bistable output storage circuit and associated OUT-MUX means connected to be inputted by said bistable output storage circuit and by first said OUT bistable storage stage, whereby the output from said bistable output storage circuit selects the output of said first OUT bistable storage stage as said secondary OUT-signals, now synchronized with said output clock signals.

13. The invention of claim 12, wherein all said storage circuits and storage means comprise bistable edge-triggered storage circuits.

\* \* \* \* \*